United States Patent [19]

Sloane

[11] Patent Number: 4,775,852
[45] Date of Patent: Oct. 4, 1988

[54] APPARATUS FOR COMPENSATING DIGITAL TO ANALOG CONVERTER ERRORS

[75] Inventor: Edwin A. Sloane, Los Altos, Calif.

[73] Assignee: Schlumberger Systems & Services, Inc., Palo Alto, Calif.

[21] Appl. No.: 73,297

[22] Filed: Jul. 13, 1987

Related U.S. Application Data

[63] Continuation of Ser. No. 807,765, Dec. 10, 1985, abandoned, which is a continuation of Ser. No. 542,302, Oct. 14, 1983, abandoned, which is a continuation-in-part of Ser. No. 204,979, Nov. 7, 1980, Pat. No. 4,419,656.

[51] Int. Cl.[4] .............................................. H03M 1/06
[52] U.S. Cl. .................................................. 341/118
[58] Field of Search ................. 340/347 AD, 347 CC, 340/347 DA; 364/571

[56] References Cited

U.S. PATENT DOCUMENTS

| | | | |
|---|---|---|---|
| 3,872,434 | 3/1975 | Duvall | 340/347 AD UX |
| 4,097,753 | 6/1978 | Cook | 340/347 CC |
| 4,186,384 | 1/1980 | Acker | 340/347 CC |
| 4,193,066 | 3/1980 | Morrison | 340/347 CC |
| 4,251,803 | 2/1981 | Debord | 340/347 CC |

OTHER PUBLICATIONS

E. A. Sloane et al., IEEE Int'l Test Conference 1983 Proceedings, 18-20th Oct. 1983, paper 2.4, pp. 598-605.
J. R. Stockton et al., Electronics Letters, Nov. 23, 1978, pp. 790-791.

*Primary Examiner*—Charles D. Miller
*Attorney, Agent, or Firm*—Theodore S. Park; David H. Carroll; Jonathan A. Small

[57] ABSTRACT

A high precision analog to digital converter comprises the combination of an imperfect or low resolution digital to analog converter having an error function known in terms of orthonormal components and an error compensating device capable of generating correction terms which do not interact with one another. The correction terms are based on orthonormal components namely, the Walsh function components, of each signal level to be compensated. At most only one weighting value per bit is required, the combination of which will compensate for errors of any bit combination. In a specific embodiment employing feedback compensation, the output of the low resolution converter and of the compensating device may be summed to produce a high performance, high precision converter with increased accuracy and resolution.

10 Claims, 2 Drawing Sheets

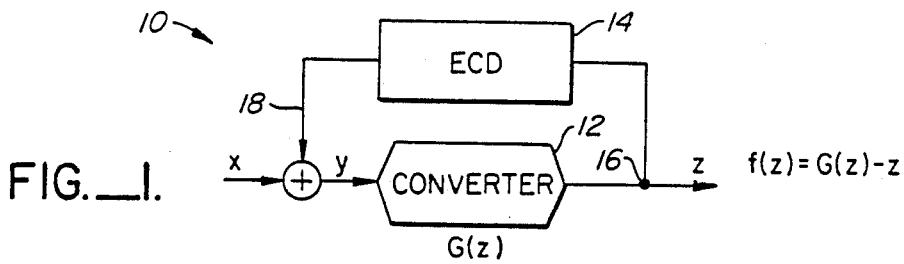
FIG._1.
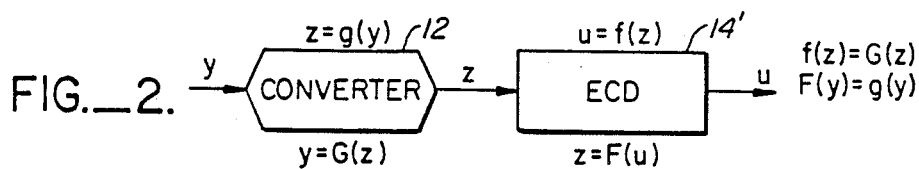
FIG._2.
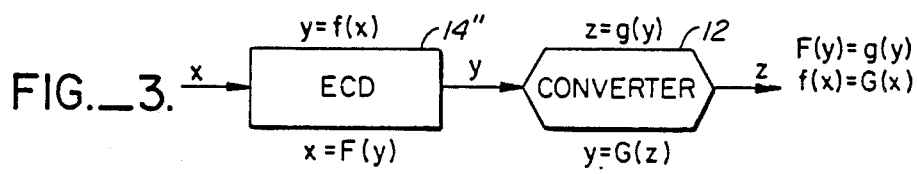
FIG._3.
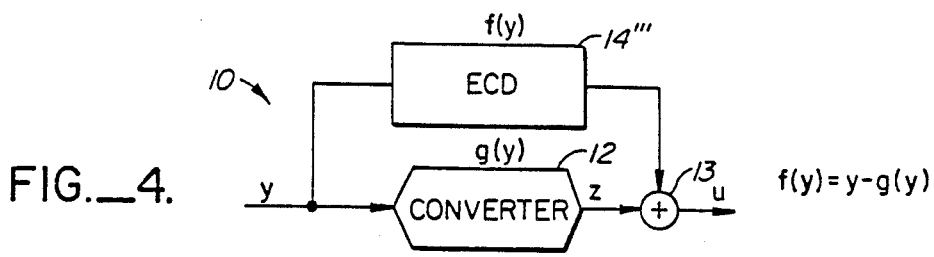
FIG._4.
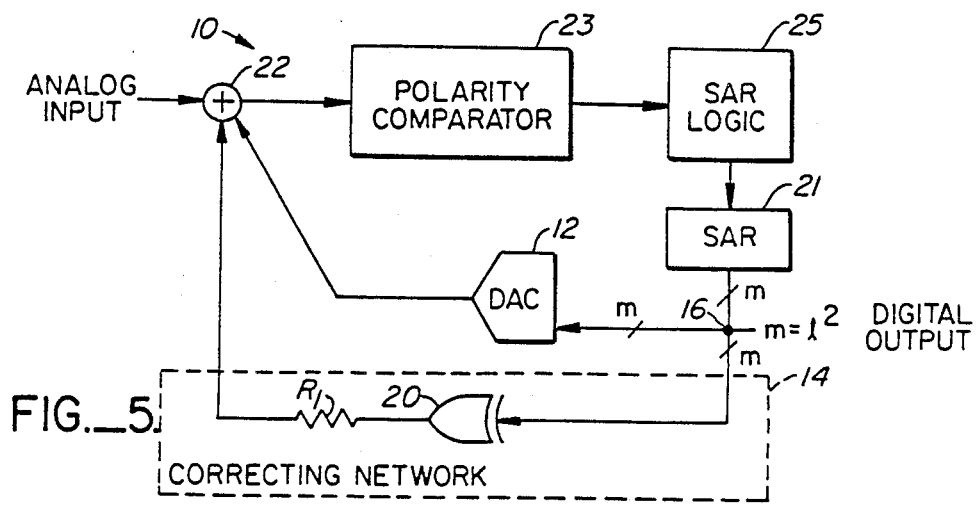
FIG._5.

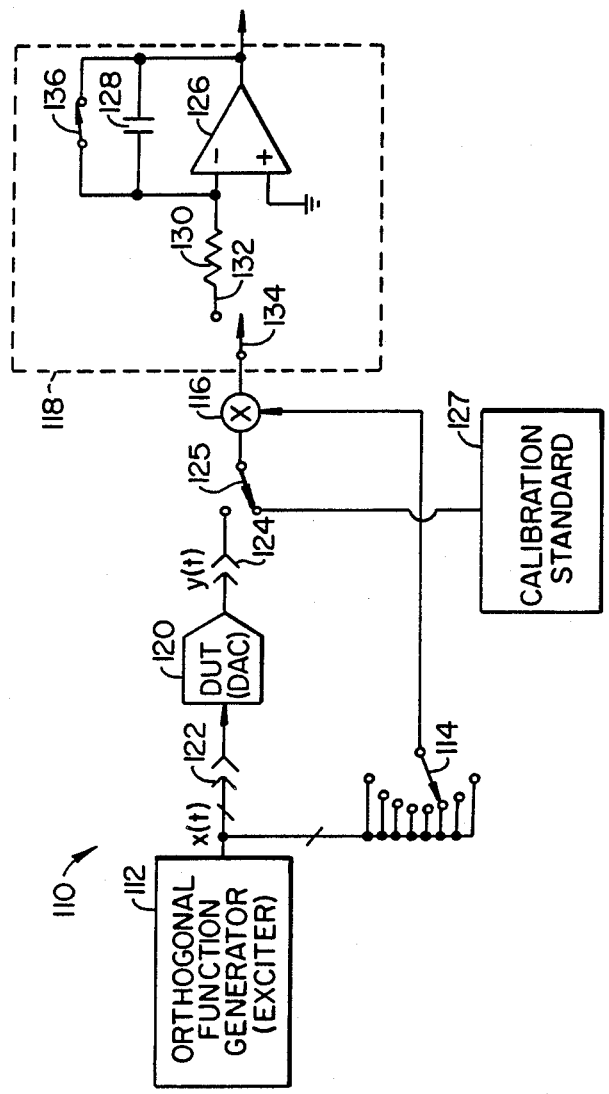
FIG._6.

APPARATUS FOR COMPENSATING DIGITAL TO ANALOG CONVERTER ERRORS

This is a continuation of Ser. No. 807,765, filed Dec. 10, 1985, now abandoned, which is a continuation of Ser. No. 542,302, filed Oct. 14, 1983, abandoned, which is a continuation-in-part of allowed co-pending patent application Ser. No. 204,979, filed Nov. 7, 1980 now U.S. Pat. No. 4,419,656, issued Dec. 6, 1983. Cross reference is also made to co-pending U.S. patent application Ser. No. 364,374, filed Apr. 1, 1982 and U.S. Pat. Nos. 4,335,373, issued June 15, 1982 and 4,354,177, issued Oct. 12, 1982. The subject matter of each of which is incorporated by reference and made a part hereof. Reference is also made to concurrently filed application Ser. No. 542,286, the subject matter of which is incorporated by reference herein and made a part hereof.

BACKGROUND OF THE INVENTION

1. Field of the Invention

This invention relates to digital electronic converters and particularly to methods and apparatus for converting analog signals into digital signals.

Converters between digital and analog domains are employed to interface between digital electronic circuitry and devices requiring analog signals. Accuracy of conversion, gain and repeatability in the process of conversion are matters of concern which are important to evaluate and for which compensation is frequently required.

Precision converters are needed for critical conversion applications. However, precision converters are generally expensive and difficult to implement. Reasonable cost, commercial quality converters frequently suffer from errors in conversion which render them unusable for critical applications. What is needed is a technique for increasing the accuracy of reasonably reliable commercially available converters so they can be used even in critical applications.

2. Description of the Prior Art

Trimming techniques for analog to digital and digital to analog converters have been suggested for limited purposes. For example, L. F. Pau, "Fast Testing and Trimming of A/D and D/A Converters in Automatic Test Systems", 1978, IEEE Auto Test Conference, has suggested a method for trimming converters based on the use of Walsh functions. A more generalized proposal for correction of converter errors based on Walsh functions is described in J. T. Millman, "Error Minimization of Data-Converting Systems via Generalized Spectral Analysis," Ph.D. Thesis, Massachusetts Institute of Technology, submitted Aug. 21, 1975 (available Oct. 27, 1975). Specifically, Millman suggests the use of on-the-converter error-correction circuitry employing Walsh functions which can be generated through the use of EXCLUSIVE OR functions under control of a programmable read only memory. Millman suggests incorporation of correction circuitry into the original design and layout of a digital to analog converter and specifically the provision of fine control of the current-setting resistor internal to the digital to analog converter. However, Millman recognized the infeasibility of implementing on-the-converter correction circuitry for any interactive Walsh function errors in existing circuitry. Millman's work has been limited to internal compensation and has made no suggestion for alternative solutions.

Intersil, Inc. of Cupertino, Calif. manufactures a correcting digital to analog converter device under the trade name ICL 7134. The ICL 7134 is a multiplying digital to analog converter which has a programmable read only memory array for controlling a 12 bit correcting digital to analog converter in the same device. The structure allows for modulo-32 cyclical corrections to be applied to the signal output. However, with the Intersil device, it is very difficult to correct for non-linearities in the analog output because all digitial input functions are interrelated. Furthermore, only a group of the most significant bits are used for error correction so that significant errors involving the lower significant bits are potentially ignored.

SUMMARY OF THE INVENTION

According to the invention, a high precision analog to digital converter comprises the combination of an imperfect or low resolution analog to digital converter (typically constructed around a digital to analog converter) having an error function known in terms of orthonormal components and an error compensating device capable of generating correction terms which do not interact with one another. The correction terms are based on orthonormal components, namely, the Walsh function components, of each signal level to be compensated. At most only one weighting value per bit is required, the combination of which will compensate for errors of any bit combination. In a specific embodiment, the feedback output of the low resolution converter and of the compensating device are summed to produce a high performance, high precision converter.

In specific embodiments, the compensating device responds to selected digital bit inputs to produce an analog output which is summed at an intermediate summing junction with the analog signal of the feedback digital to analog converter at a feedback input. Each digital input signal to the compensating device is decomposed and analyzed by Walsh function expansion of the input. The respective Walsh function expansions are to then weighted to compensate for the error components, and a corresponding compensation signal is added to the analog input signal of the converter to be compensated. The error compensation signal is generated by a suitable inverse transformation using logical combinational operations on the digital signal.

In one specific embodiment of the invention, a plurality of EXCLUSIVE OR gates is coupled to receive a plurality of selected bit signal inputs whose source is the device output terminal. Each such gate then drives a single pre-adjusted resistor whose value is selected as an analog signal weighting element to produce the analog compensating signal.

The combination of the EXCLUSIVE OR gates with weighting resistors minimizes the number of circuit components. To this end, the EXCLUSIVE OR gates decode the digital input based on an analysis of the decomposed error function associated with the particular converter and particular error function.

Other configurations are serial post correction, serial precorrection and feedforward correction.

The preferred embodiment employs an error correcting device in feedback connection with the analog to digital converter wherein digital signals are sensed at the output of a successive approximation register, converted to analog signals and then weighted and added. The weighted analog signals are added to the analog signal generated by an internal digital to analog converter in feedback connection to the analog input.

The invention will be better understood by reference to the following detailed description taken in connection with the accompanying drawings.

BRIEF DESCRIPTION OF THE DRAWINGS

FIG. 1 is a block diagram of a device according to the invention wherein feedback correction is employed.

FIG. 2 is a block diagram of the invention wherein serial post-correction is employed.

FIG. 3 is a block diagram of the invention wherein serial pre-correction is employed.

FIG. 4 is a block diagram of the invention wherein feedforward connection is employed.

FIG. 5 is a block diagram of a specific embodiment of a feedback correction network according to the invention.

FIG. 6 illustrates a device which decomposes a digital signal into a single correcting signal for each combination of bits and further which generates a compensating signal from Walsh function or like orthogonal function generator components.

DESCRIPTION OF SPECIFIC EMBODIMENTS

It is known that Walsh functions are well suited to the representation of memoryless transfer characteristics of mixed signal devices such as digital to analog converters and analog to digital converters employing digital to analog converters internally. This is because the Walsh functions form a complete set of orthogonal two-state functions capable of representing any reasonable function spanning a multiple of a binary number of intervals. As a consequence, all compensating functions based on the orthogonal binary functions are independent of one another and hence do not interact in any potential adjustment or correction scheme. However, Walsh functions are but one example of an orthonormal set of digital functions upon which correction signals may be based. Reference is made to the parent patent, U.S. Pat. No. 4,419,656, incorporated by reference herein, for a discussion of such functions.

Referring to FIG. 1, there is shown one embodiment of a converter system 10 according to the invention comprising an analog to digital converter 12 having a known error characteristic or error function and a compensating device 14. The compensating device 14 responds to the digital output at an output node 16 of the converter 12 and produces an analog output on an analog signal line 18 as an analog compensating signal. The function of the converter 12 may be expressed as g(y) which produces a digital signal z in response to an analog input signal y. The error compensating device 14 may be expressed as a function f(z). The forward function f(z) is specifically tailored to produce a value equal to the value G(z)−z expressed in analog terms at its output where G(z) is the reverse function of the converter 12. The sum of the analog correction signal on line 18 and the analog input signal x is a value y which is the desired input signal in analog form to the converter 12. The y valued signal in a properly designed system 10 is a properly scaled analog signal to produce a properly scaled digital output signal z corresponding to the analog input signal x.

Referring to FIG. 2, there is shown another possible configuration for an apparatus according to the invention.

In this embodiment a signal z is applied to an error compensating device 14' which produces an output signal u which is a function f(z). A converter 12 having a function g(y) produces the digital output signal z to be corrected. This scheme is called serial post-correction. In this embodiment the error correcting device may contain a digital look-up device.

FIG. 3 illustrates serial pre-correction wherein an error compensating device 14'' applies an analog output signal y to the converter 12. In this case, the forward function of the error compensating device 14'' f(x) is equal to the reverse function G(x) of the converter 12, and the reverse function F(y) of the error compensating device 14'' is equal to the forward function g(y) of the converter 12.

FIG. 4 illustrates a feedforward technique for correcting converter output. The error compensating device 14''' receives as an analog input the input signal y to the converter 12 and provides a digital output to a digital adder 13. The adder 13 adds a digital signal to the digital output signal z, the sum of which is the desired output signal u of the device 10.

Either the forward transfer characteristic of the converter 12 or the inverse function of the converter 12 must be known in terms of orthonormal components before compensation may be applied. The forward transfer characteristic may be obtained by uniformly varying the input to the device and observing the response to which inverse Walsh domain filtering may be applied. Equivalently, since the source of error in an analog to digital converter may be the internal digital to analog converter, the internal digital to analog converter may be separately analyzed and the inverse function can be obtained by analysis.

The inverse function may be obtained by using a uniformly distributed input function y, so that:

$$p(y) = 1/Y$$

And noting that the density function of the response function is:

$$p(z) = p(y) \frac{dy}{dz} = \frac{1}{Y} G'(z)$$

so that $$G(z) = Y \int p(z) dz$$

In the case of ADC, G(z) might also be obtained by means of exponential excitation as described in the parent case referenced above.

Each of the compensating methods have preferred applicability to either ADC's or DAC's depending on the availability of the digital code. Consider for instance, the following input/output relationship:

$$z = g(y) = g(ny_o) = g(n)$$

Where the input, y, is uniformly quantized with increments of $y_o$. In terms of the Walsh functions:

$$z = \sum_{k=o}^{2^m-1} g_k \cdot \psi_k(n), \quad 2^m y_o = 1$$

where $$g_k = \sum_{n=0}^{N-1} g(n) \cdot \psi_k(n)$$

The output, z, at any given quantized input state, n, will be the weighted sum of all the significant Walsh terms. The set of weights, $(g_k)$, will be either added or subtracted depending on the sign of the Walsh functions, $\{\Psi_k(n)\}$, at state n. Because the state of the binary order Walsh functions, $\{\Psi_{2^l}(n)\}$, is known from the input state n, i.e., the corresponding binary input code indicates the sign of the binary ordered functions, the sign of any other (non-binary) Walsh function may be determined by means of the generating rule. Thus;

$$\psi_{k \oplus l}(n) = \psi_k(n) \cdot \psi_l(n)$$

If $k \neq l$ and both are of binary order, $$\psi_{k+l}(n) = \psi_k(n) \cdot \psi_l(n)$$

And the sign (signum) of the resultant will be;

$$sgn\{\psi_{k+l}(n)\} = sgn\{\psi_k(n)\} \cdot sgn\{\psi_l(n)\}$$

In general, the sign will be the product of the appropriate binary ordered Walsh functions which are determined by the binary code of the input state n.

The equivalent logical operation based on the logical (on-off) representation of the Walsh functions is:

$$\overline{\phi}_{k \oplus l}(n) = \phi_k(n) \oplus \phi_l(n)$$

Where $\oplus$ represents the EOR operation, and $\overline{\phi}$ is the logical complement of $\phi$. The availability of quantized data is an important consideration in the selection of a correction scheme for an analog to digital converter. A digital to analog converter has quantized inputs. Hence the method of FIG. 1, feedback correction is best suited for applications with an analog to digital converter.

FIG. 5 illustrates a specific embodiment of an analog to digital converter device 10 having feedback correction. In FIG. 5, a converter 12 receiving input from a successive approximation register 21 is fed by m bits of information, m bits of which are applied to the converter 12 and the m bits being applied to an error compensating device 14. Only one representative channel of the error compensating device 14 is shown. In practice, the error compensating device 14 may have as many channels as converter bits, and in general less. The error compensating device 14 comprises a plurality of channels of EXCLUSIVE OR gates 20 each receiving a different set of digital input bit lines of the m input signals. The exact input bit line configuration is defined by the orthogonal components of the error function associated with the converter 12. Each EXCLUSIVE OR gate 20 is provided with TRUE input states of one level to be corrected. The weighting of the signal line set is either added or subtracted and the magnitude of the weighting is defined by a resistance of the corresponding EXCLUSIVE OR gate $R_1$ corresponds to the weight for gate 20. In the specific embodiment, the EXCLUSIVE OR gate 20 is a device having an output suitable for driving the corresponding output resistor R1. The output resistor is in turn coupled to a summer 22 with the output of the converter 12. An operational amplifier is a suitable summer. Whenever any one of the EXCLUSIVE OR gate outputs is true, an analog signal is generated representing the corresponding orthogonal component of the input digital signal. The analog signals add at the summing junction. The analog output of the summer 22 is the desired corrected analog signal to be applied to the feedback input of the device 10. The corrected input is then applied to a polarity comparator 23 whose output is applied to the SAR logic subsystem 25 which in turn runs the successive approximation register 21. The digital output is taken from the output node 16.

Turning to FIG. 6, there is shown a block diagram of a basic embodiment of a digital-to-analog converter (DAC) test system 110 for testing a DAC or for calibrating a DAC for use in other tests. The DAC test system 110 comprises an orthogonal function generator or exciter 112, a selector switch 114, a multiplier 116, and an integrater 118. The device to be tested or device under test (DUT) 120 is a DAC coupled between a digital output terminal plug 122 and a single line analog input terminal 124. The exciter 112 has a digital output bus coupled to the output terminal plug 122 and to the selector switch 114. The selector switch 114 couples one bit line of the output bus to the input of multiplier 116. In the case of a two state or Walsh function generator, the multiplier 116 may be a simple two-state (positive/negative) multiplier of an analog signal applied through analog input terminal 124. A calibration switch 125 is preferably provided between the analog input terminal 124 and the multiplier 116 to allow connection of a calibration standard 127 to the input of the integrater 118. The calibration standard 127 may be a known fixed voltage within the intended amplitude range of the DUT 120. By applying a known fixed voltage to the input of the integrator 118 for a known time period and examining the response, the integrator 118 is calibrated.

The integrator 118 comprises an operational amplifier 126 having an integrating capacitor 128 between the inverting input and the output, a timing resistor 130 in the inverting input feed line 132, and two integration switches, namely, a normally open input switch 134 in the inverting feed line 132 and a normally closed integration switch 136 across the capacitor 128. As will be recognized by those skilled in the art, an integration of the input signal will be performed whenever switch 136 is opened while switch 134 is closed. The exciter 112, DUT 120, selector switch 114 and integration switches 134 and 136 are operated off of a common master clock to insure synchronous and accurate integration for the time period of the converter test. It should also be recognized that the device under test 20 is capable of latching its level of output for a period corresponding to a conversion interval. Any set of orthogonal functions can be employed in the invention. However, two state orthogonal functions work particularly well in digital systems. The Walsh functions are a well-defined example of a set of suitable orthogonal functions. Hence, the specific examples which follow therefore refer to the Walsh functions for purposes of illustration and not limitation.

The invention has now been explained with reference to the specific embodiments. Other embodiments will be apparent to those of ordinary skill in the art. For example, one of the advantages of a correction network as shown herein is that no more than one weighting factor per bit is required, since each weighting factor is determined by an analysis of the orthonormal characteristics of that bit with respect to all other bits. Simple EXCLUSIVE OR logical correcting networks have been found to require normally only pairs of input data bits, and generally 0, 1, 2 or 3 combinations of input bits for purposes of correction. Large complex networks are thus unnecessary, and correction networks can be incorporated into devices easily coupled together with ordinary digital to analog converters. Variable resistors may be used for weighting, the adjustments of which can be made empirically, based on an error function analysis by orthonormal components of the converter to be corrected. It is therefore not intended that this invention be limited except as indicated by the appended claims.

I claim:

1. An apparatus for converting an analog input signal to a digital output signal comprising:
   an analog to digital converter device means for which a digital signal conversion error is known for at least a plurality of output bits combinations in terms of binary valued orthonormal components of said conversion error, for producing a digital signal in response to an analog signal;
   means coupled to said converter device means and responsive to an input consisting of combinations of said binary valued orthonormal components for producing a compensating signal which is specific to said conversion error for each said output bit combination and which is non-interacting with said analog signal; and
   means for adjusting said digital output signal in accordance with said conversion error for producing a corrected digital output signal.

2. The apparatus according to claim 1 wherein said compensating signal producing means comprises means for decomposing bit signals corresponding with each combination of bits to be compensated into a single correcting signal for each said combination of bits to be compensated, and means for weighting said correcting signal to produce said compensating signal.

3. The apparatus according to claim 2 wherein said compensating signal producing means comprises means responsive to said bit signals as Walsh function components for generating said correcting signal.

4. The apparatus according to claim 3 wherein said analog to digital converter device means comprises a polarity comparator means coupled to receive an input analog signal, a successive approximation register means coupled to receive output of said polarity comparator means to produce a digital output signal, a digital to analog converter means coupled to receive output of said successive approximation register means to produce an analog feedback signal and summing means coupled to sum a feedback signal and said analog input signal for input to said polarity comparator, and wherein said error compensating device means comprises at least one EXCLUSIVE OR gate coupled to receive at least selected ones of said digital output signals to produce a two-level correcting signal, and wherein said weighting element comprises a resistor for converting said correcting signal into a compensating signal, said compensating signal being coupled in feedback to said summing means for compensating for converter errors in said analog to digital converter device means.

5. An apparatus for converting an analog input signal to a digital output signal comprising:
   a digital to analog converter device means responsive to said digital output signal for producing an analog feedback signal;
   an analog signal error compensating device means responsive to said digital output signal and including means identifying conversion error of said apparatus with at least a plurality of binary-valued bit combinations defining said digital output signal, for producing an analog compensating signal specific to said conversion error and non-interacting with said digital to analog converter device means, each bit of said binary-valued bit combination corresponding with a binary-valued orthonormal component of said conversion error; and
   means for summing said analog feedback signal and said analog compensating signal to produce said analog inptu signal for conversion to said digital output signal.

6. The apparatus according to claim 5 wherein said compensating signal producing means comprises means responsive to said bit combination as Walsh function components for generating said analog compensating signal.

7. The apparatus according to claim 5 wherein said compensating signal producing means comprises:
   a plurality of EXCLUSIVE OR gates operative to combine selected ones of said digital output signal values into a plurality of error correcting signals, each one of said error correcting signals corresponding to one said binary-valued orthonormal component; and
   a weighting element, said weighting element for producing said compensating signal.

8. The apparatus according to claim 6 wherein said compensating signal producing means comprises:
   a plurality of EXCLUSIVE OR gates operative to combine selected ones of said digital output signal values into a plurality of error correcting signals, each one of said error correcting signals corresponding to one said binary valued orthonormal component and
   a weighting element, said weighting element for producing said compensating signal.

9. The apparatus according to claim 5 wherein said compensating signal producing means comprises means for decomposing said digital output signal into orthogonal components and further including an EXCLUSIVE OR means for combining values representing selected ones of said orthogonal components into a single correcting signal for each combination of bits to be compensated, and at least one weighting element, each weighting element coupled to receive only one said correcting signal for producing a component of said analog compensating signal.

10. The apparatus according to claim 9 wherein each said weighting element is a resistor, said resistor being driven by the output of said corresponding EXCLUSIVE OR gate.

* * * * *